United States Patent
Barnes

(10) Patent No.: US 6,420,909 B1
(45) Date of Patent: Jul. 16, 2002

(54) COMPARATORS

(75) Inventor: William Bryan Barnes, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 09/302,316

(22) Filed: Apr. 29, 1999

(30) Foreign Application Priority Data

May 1, 1998 (GB) .............................................. 9809440

(51) Int. Cl.[7] .................................................. H03K 5/22
(52) U.S. Cl. .............................. 327/63; 327/65; 327/72
(58) Field of Search ........................ 327/307, 67, 74, 327/63, 65, 72, 205, 206, 543

(56) References Cited

U.S. PATENT DOCUMENTS

| | | | |
|---|---|---|---|
| 3,683,284 A | 8/1972 | Mueller ....................... 328/117 |
| 4,358,752 A | 11/1982 | Tamada et al. ........ 340/347 AD |
| 4,462,002 A | 7/1984 | Schade, Jr. ................. 330/253 |
| 4,529,891 A | 7/1985 | Oida .......................... 307/355 |
| 4,553,098 A | 11/1985 | Yoh et al. ................... 324/433 |
| 4,634,905 A | 1/1987 | Campbell, Jr. ............... 307/594 |
| 4,912,420 A | 3/1990 | Parnell ....................... 328/147 |
| 4,940,907 A | 7/1990 | Laude ........................ 307/359 |
| 5,003,196 A | * 3/1991 | Kawaguchi .................. 327/62 |
| 5,043,599 A | 8/1991 | Zitta .......................... 307/355 |
| 5,159,260 A | 10/1992 | Yoh et al. .................... 323/313 |
| 5,268,872 A | 12/1993 | Fujii et al. ............. 365/189.07 |
| 5,530,395 A | * 6/1996 | Ting .......................... 327/543 |
| 5,694,072 A | * 12/1997 | Hsiao et al. ................. 327/537 |
| 6,072,349 A | * 6/2000 | Pippin et al. ................ 327/307 |

FOREIGN PATENT DOCUMENTS

| | | | |
|---|---|---|---|
| EP | 0 367 707 A3 | 9/1989 | ............. H03F/3/45 |
| EP | 0 736 975 A1 | 4/1996 | |

* cited by examiner

*Primary Examiner*—Tuan T. Lam
*Assistant Examiner*—Hiep Nguyen
(74) *Attorney, Agent, or Firm*—Lisa K. Jorgenson; Allen, Dyer, Doppelt, Milbrath & Gilchrist, P.A.

(57) ABSTRACT

A circuit compares a first voltage and a second voltage using a comparator. The comparator has a current divider for dividing a bias current in accordance with the values of the first and second voltages, and for providing two currents. The comparator also has a current differentiation circuit for receiving the two currents and providing an output signal dependent upon the difference between the currents. At least one of the current divider and current differentiation circuits are arranged to weight one of the two currents with respect to the other current so that the output signal is only provided when the difference between the first and second voltages exceeds an offset value. A bias generator is provided which includes a second comparator having similar components in the same configuration as the comparator.

47 Claims, 3 Drawing Sheets

COMPARATORS

FIELD OF THE INVENTION

The present invention relates to integrated circuits, and, more particularly, to a comparator.

BACKGROUND OF THE INVENTION

Comparator circuits are known and a typical. comparator circuit 1 is shown in FIG. 1. The comparator circuit 1 shown in FIG. 1 includes two pairs of transistors. The first and second transistors 2 and 4 are N channel field effect transistors (FETs) and defining the first pair of transistors. The first and second transistors 2 and 4 are matched. The source of each of the first and second transistors 2 and 4 is connected to ground. The gates of the first and second transistors 2 and 4 are connected to each other by a first line 6. The drain of the first transistor 2 is connected to its gate.

The third and fourth transistors 14 and 18 are P channel FETs and define the second pair of transistors. The third and fourth transistors 14 and 18 are matched. The gate of the third transistor 14 is connected to a first voltage V1 while the gate of the fourth transistor 18 is connected to a second voltage V2. The first and second voltages V1 and V2 are to be compared. One of the first and second voltages V1 and V2 may be a reference voltage. The drain of the third transistor 14 is connected to the drain of the first transistor 2. The sources of the third and fourth transistors 14 and 18 are connected to a voltage supply Vcc or a current source.

The output of the comparator 1 is taken from an output node 20 which is between the drain of the fourth transistor 18 and the drain of the second transistor 4. The output node 20 is connected to the input of an inverter 22 or any other additional gain stages yielding a logic output. The output of the inverter 22 represents the result of the comparison. If the output of the inverter 22 is high, then the first voltage V1 is less than the second voltage V2. If the output of the inverter 22 is low, then the second voltage V2 is less than the first voltage V1.

The operation of the circuit 1 shown in FIG. 1 will now be described. The first and second voltages V1 and V2 are applied to the respective gates of the third and fourth transistors 14 and 18. The size of the voltage applied to the gates of the third and fourth transistors 14 and 18 will determine how quickly these transistors are turned on. The lower the voltage applied to the gate of the third or fourth transistor 14 or 18, the more quickly that transistor will be turned on. If the first voltage V1 is less than the second voltage V2, the third transistor 14 will be turned on more quickly than the fourth transistor 18. If the third transistor 14 is on, the drain voltage of the first transistor 2 and the gate voltages of the first and second transistors 2 and 4 will depend on how quickly the third transistor is turned on. The more quickly the third transistor 14 is turned on, the higher the voltage applied to the gates of the first and second transistors 2 and 4 and the more quickly the first and second transistors 2 and 4 are turned on. The voltage at the output node 20 will tend to be pulled low if the second transistor 4 is relatively quickly switched on in comparison to the first transistor 18. Thus, the output of the inverter 22 will be high.

If the second voltage V2 is less than the first voltage V1, the fourth transistor 18 will be switched on more quickly than the third transistor 14. If the third transistor 14 is switched on relatively slow, a lower gate voltage will be applied to the first and second transistors 2 and 4. This in turn means that the first and second transistors will be relatively slowly turned on. As the second transistor 4 is relatively slowly turned on and the fourth transistor 18 is relatively quickly turned on, the output node 20 will tend to be pulled up so that the voltage at this node will be high. Accordingly, the input to the inverter 22 will be high and thus the output of the inverter 22 will be low.

One well known use of comparators is in a Schmitt trigger. A typical Schmitt trigger is shown in FIG. 2. The principal behind a Schmitt trigger will be described in relation to FIG. 3 which shows how two voltages Vinp and Vinn vary with time. For simplicity, Vinn is a constant voltage whereas Vinp varies with time. FIG. 3 also shows the associated set and reset signals produced by the Schmitt trigger.

The Schmitt trigger is arranged to provide a set (or reset) signal each time Vinp exceeds the value of Vinn by a certain value. The Schmitt trigger provides a set signal in the example shown in FIG. 3 when Vinp exceeds Vinn by a value equal to Vthreshold1. Likewise, a reset (or set) signal is provided when Vinp is less than Vinn by a predetermined amount. In the example, the reset (or set) signal is provided when Vinp is less than Vinn by a value equal to Vthreshold2. The use of threshold values Vthreshold1 and Vthreshold2 means that it is less likely that a noisy input voltage would produce false set and/or reset signals.

FIG. 2 shows a Schmitt trigger which operates in accordance with the principals shown in FIG. 3. The Schmitt trigger includes two comparator circuits 1 of the type shown in FIG. 1. Additionally, the positive input of each comparator circuit 1 can be regarded as having a voltage source 13 and 15 respectively connected to the input. These voltage sources 13 and 15 determine the threshold value Vthreshold1 and Vthreshold2. Typically, these voltage sources 13 and 15 will take the form of a feedback circuit which connects the output of the comparator 1 to its input.

Typically a high input impedance differential Schmitt trigger requires a pair of controlled offset buffers to form these voltage sources 13 and 15. If the high input impedance or differential inputs were not required, a Schmitt trigger can be formed using a single comparator and a resistive positive feedback network.

SUMMARY OF THE INVENTION

An object of the present invention to provide a comparator which avoids or reduces the problems of the known arrangements as discussed above.

According to one aspect of the present invention, a circuit for comparing a first voltage and a second voltage includes a comparator having a current divider for dividing a bias current in accordance with the values of the first and second voltages, and for providing two currents. A current differentiation circuit receives the currents and provides an output dependent upon the difference between the currents. At least one of the current divider and current differentiation circuits weights one of the currents with respect to the other so that a given output signal is only provided when the difference between the first and second voltages exceeds an offset value. A bias generator includes a second comparator in the same configuration having the same components as the other comparator.

In this way, a comparator with an offset voltage can be provided without the need to provide the additional elements required, for example, to implement the Schmitt trigger of FIG. 2. Preferably, at least one of the current divider and current differentiation circuits includes a pair of transistors. At least one pair of transistors may not be matched to weight one of currents with respect to the other. The current differentiation circuit may include a current mirror.

Preferably the current divider includes a first pair of transistors of a first polarity or channel type, and the current differentiation circuit includes a second pair of transistors of a second polarity. Each transistor of each pair includes first and second current path terminals and a control terminal. The control terminals of the first pair of transistors are arranged to receive the first and second voltages respectively. One of the current path terminals of each of the first pair of transistors are arranged to be connected to receive a part of the biasing current, and the other of the current path terminals of the first pair of transistors are connected to one of the current path terminals of a respective one of the second pair of transistors. An output is between one transistor of the second pair and the transistor of the first pair connected to the one transistor of the second pair.

If at least one of the pairs of transistors is not matched, a given output is only provided if the difference between the first and second voltages exceeds a predetermined offset. In other words, a comparator with an offset voltage is provided without the use of feedback resistors or the like. Additionally, the comparator may have only the same number of transistors as the known comparators, but also has the offset difference between the two voltages which has to be present before a given output is provided.

Preferably, the other ones of the current path terminals of the second pair of transistors are connected to a second power supply, and the control terminals of the second pair of transistors are connected to each other and to one of the current path terminals of the other of the transistors of the second pair. Preferably, the first pair of transistors are P channel transistors and the second pair of transistors are N channel transistors. However, it is possible in embodiments of the present invention that the first pair of transistors may be N channel transistors and the second pair of transistors may be P channel transistors.

The first pair of transistors may not be matched. Alternatively, the second pair of transistors may not be matched. It is also possible in embodiments of the present invention that both of the first and second pairs of transistors are not matched. It should be appreciated that the relative sizes of the transistors in each pair allows a suitable offset value to be achieved.

Preferably, an inverter or gain stage providing a logic output is connected to the output. This is advantageous in that a digital output can be achieved from the comparator. The given output may be provided if the difference between the first and second voltages exceed the threshold, and if the difference is less than the threshold a different output may be provided.

Preferably, the bias generator includes a bias transistor, the control terminal of which is arranged to receive a bias voltage. This transistor may be regarded as being a current source. Preferably, the bias transistor is of the first polarity. The second comparator may include first and second pairs of transistors and a second bias transistor which are substantially the same and connected in the same manner as the respective first and second pairs of transistors and the bias transistor of the comparator.

Preferably, compensation circuitry is provided. The compensation circuitry may, in use, alter the voltage applied to the second bias transistor of the second comparator in response to changes in a voltage output by the first and second pairs of transistors of the second comparator. Thus, if the output of the first and second pairs of the transistors alters, then so will the voltage applied to the second bias transistor. Compensation for changes in temperature can be achieved as the transistors in the comparator part of the circuit match the transistors in the seconds comparator part of the circuit.

Preferably, the compensation circuitry is coupled to an output between one of the transistors of the first pair and one of the transistors of the second pair of transistors of the second comparator, and to the control terminal for the second bias transistor. In use, the voltage applied to the control terminal of the second bias transistor is also applied as the bias voltage to the bias transistor of the comparator. The output of the second comparator may correspond to the output of the comparator. The compensation circuit provides feedback from the output of the first and second pairs of transistors of the bias generator and the second bias transistor of the second comparator.

The compensation circuitry may include a sixth transistor which has its control terminal connected to the output of the second comparator, and a seventh transistor which has its control terminal connected to the control terminal of the second bias transistor of the bias generator. The sixth transistor may be of the first polarity and the seventh transistor may be of the second polarity. Preferably, the control terminal of the seventh transistor is connected to one of its current path terminals.

Preferably, constant voltages are arranged to be applied to the second comparator. A potential divider may be provided to provide the constant voltages. By providing constant voltages, any fluctuation in the output of the bias generator can be assumed to result from changes in temperature and/or process variations. Accordingly, the bias voltage will be varied to take into account changes in temperature so that temperature and/or process variation will not influence the output of the comparator.

A Schmitt trigger may be provided which includes at least one and preferably two comparators as described above. Preferably, the Schmitt trigger includes two comparators but only one bias generator. If a number of Schmitt triggers are required with the same detection threshold, a single bias generator can be used.

BRIEF DESCRIPTION OF THE DRAWING

For a better understanding of the present invention and as to how the same may be carried into effect, reference will now be made by way of example to the accompanying drawings in which.

DETAILED DESCRIPTION OF THE PREFERRED EMBODIMENTS

Figure 4:
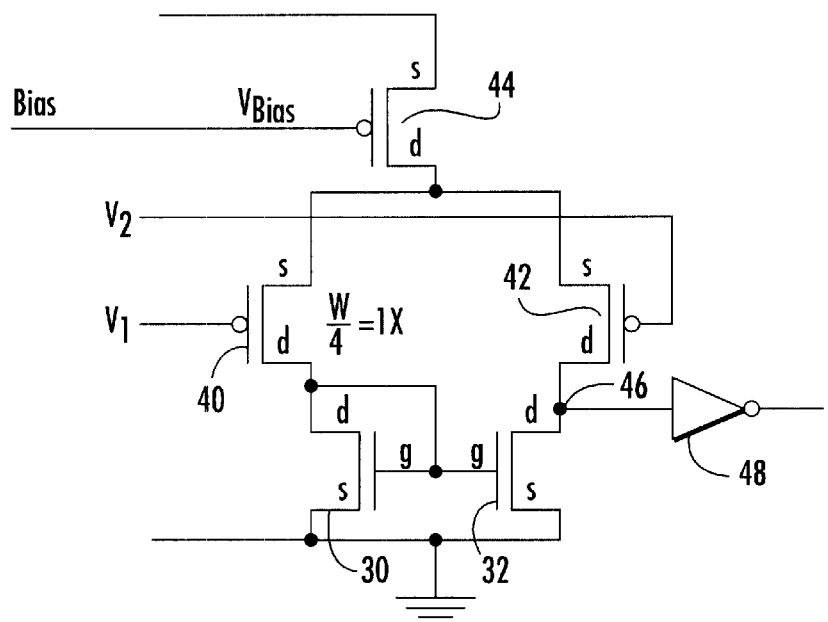
FIG. 4 shows a comparator according to the present invention.

Reference will now be made to FIG. 4 which shows a comparator embodying the present invention. The comparator comprises two matched N channel transistors 30 and 32 defining a first pair of transistors. These are the current differentiation transistors. The sources of each of the first and second transistors 30 and 32 is connected to ground. The gates of these first and second transistors 30 and 32 are connected together. The gate and drain of the first transistor 30 are connected together.

The comparator also comprises two P channel transistors 40 and 42 defining a second pair of transistors. These are the current dividing transistors. The drain of the third transistor 40 is connected to the drain of the first transistor 30. The drain of the fourth transistor 42 is connected to the drain of the second transistor 32. The gates of the third and fourth transistors 40 and 42 are arranged to receive two voltages V1 and V2 which are to be compared. The sources of the third and fourth transistors 40 and 42 are both connected to the drain of a bias P channel transistor 44.

The source of the bias P channel transistor 44 is connected to a voltage supply. The gate of the bias P channel transistor 44 receives a bias voltage. The bias P channel transistor 44 provides a generally constant current for the third and fourth transistors 40 and 42 although there may be variations in the current provided by the bias P channel transistor 44 as a consequence of changes in temperature.

An output node 46 is arranged between the drain of the fourth transistor 42 and the drain of the second transistor 32 to provide the output of the comparator. The output node 46 is connected to an inverter 48. The inverter may be replaced by any suitable additional gain stage yielding a logic output. The second pair of P channel transistors 40 and 42 are not a matched pair. In particular, one of the transistors is larger than the other. For example, the third transistor may have a width to length ratio equal to 1× while the fourth transistor 40 may have a width to length ratio of 4×. In other words, the fourth transistor 42 has a much stronger driving ability than the third transistor 40.

The operation of the comparator shown in FIG. 4 will now be described. The case where the two voltages V1 and V2 input to the respective gates of the third and fourth transistors 40 and 42 are equal will first be discussed. With the comparator shown in FIG. 1, if the first and second voltages are exactly equal, no meaningful result will be obtained from the inverter until there is some difference between the first and second voltages. It should be noted that with the comparator shown in FIG. 1, even very small differences in the first and second voltages V1 and V2 would give rise to a meaningful output from the inverter. In practice, it is rare for the first and second voltages to be exactly the same.

In FIG. 4, where the same voltage is applied to the third and fourth transistors 40 and 42, voltage V1 which is applied to the gate of the third transistor 40 will switch on that transistor to a certain degree. Accordingly, a voltage at the second node 38 is applied to the gates of the first and second transistors 30 and 32 via the first node 34. The fourth transistor 42 will also be on. However, since the width to length ratio of the fourth transistor 42 is four times that of the third transistor 40, the fourth transistor 40 will be switched on to a greater degree than the third transistor 40. The fourth transistor 42 is therefore more quickly turned on than the second transistor 32. Accordingly, the third node 46 will have a relatively high voltage so that the output of the inverter 48 is low.

The output of the inverter 48 will be high when V2−V1 is greater than Vx. The significance of Vx will be now be discussed. When V2 is greater than V1 by an amount equal to Vx, the voltage at the third node will be equal to the voltage at the second node 38 and will not be high enough to provide a high input to the inverter 48, or low enough to provide a low input to the inverter 48. When this occurs, the input to the inverter 48 will be neither high nor low and so no useful result will be provided by the inverter 48.

However, in practice, the conditions where V2−V1=Vx will be rarely achieved, and if achieved, the condition will not generally be maintained for any significant length of time. As soon as the difference between V2 and V1 varies by an amount greater or less than Vx, a high or low output will be provided by the inverter 48.

When the difference between V2 and V1 is greater than Vx, the third transistor 40 and hence the second transistor 32 will be on more quickly than the fourth transistor 42. Accordingly, the second transistor 32 will succeed in the pulling the voltage of the third node 46 down low which means that the output of the inverter 48 will be high. When the difference between V2 and V1 is less than Vx, the fourth transistor 42 will be more quickly turned on than the third transistor 40, and hence also the second transistor 32. Accordingly, the fourth transistor 42 will succeed in pulling up the voltage of the third node 46, thus providing a low output from the inverter 48.

Figure 2:
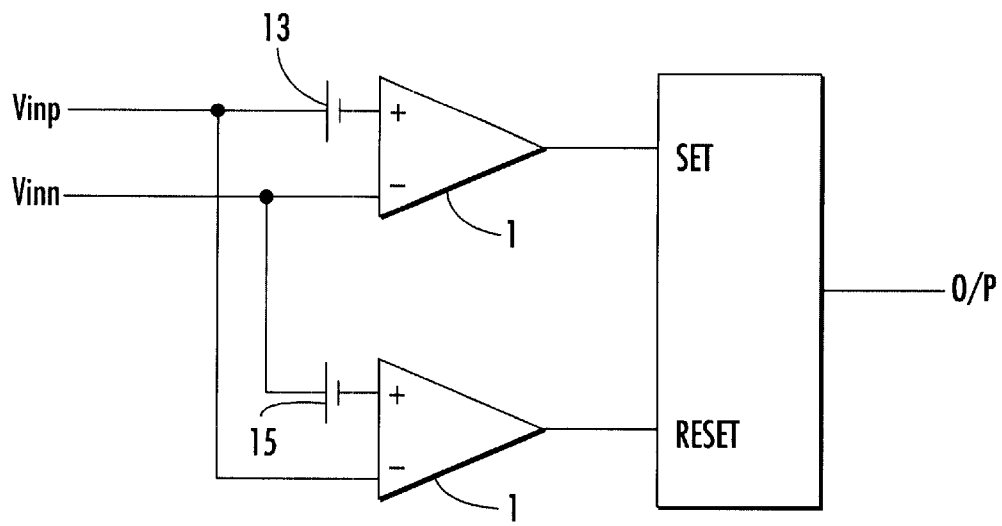
FIG. 2 shows a Schmitt trigger according to the prior art.
Figure 3:
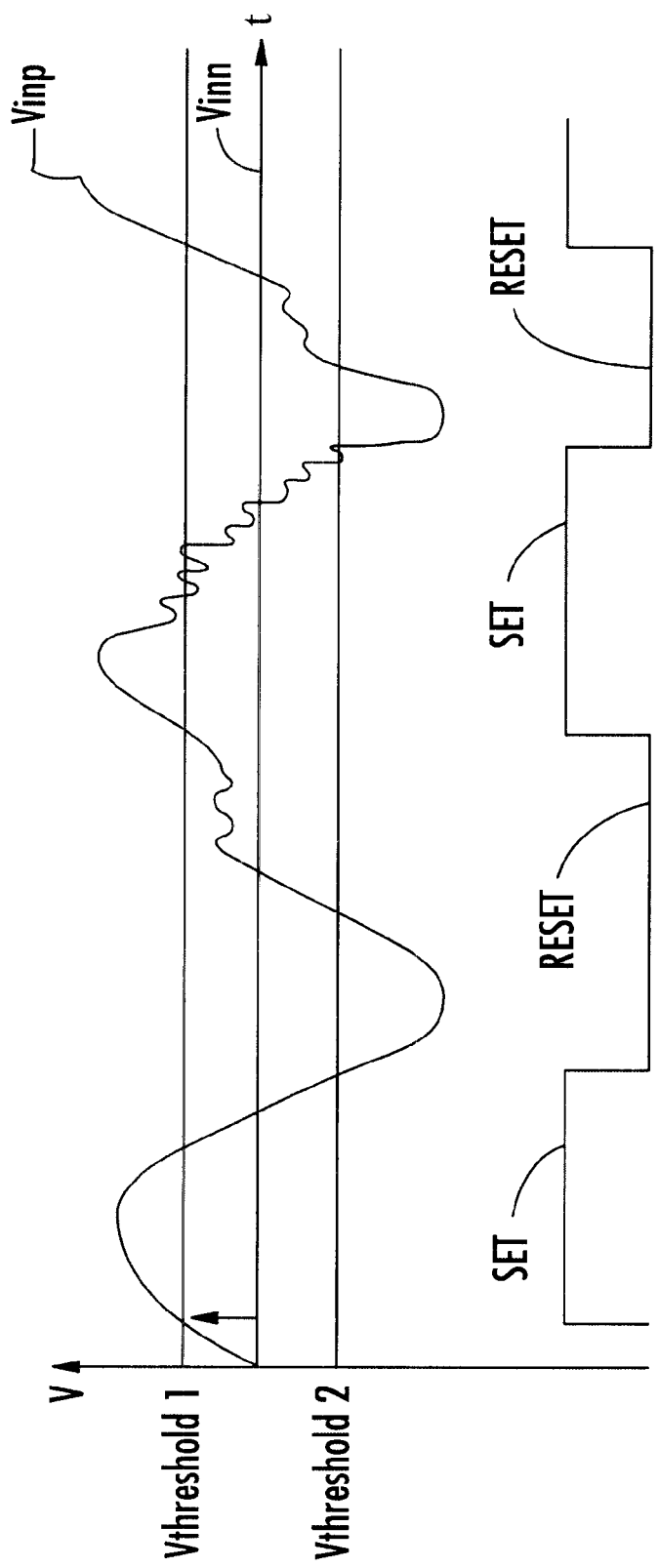
FIG. 3 shows a graph of input voltages versus time and the corresponding output of a Schmitt trigger according to the prior art.

As can be seen, a change in the output of the inverter 48 will only occur when the second voltage exceeds the first voltage V1 by more than Vx. Vx is thus equivalent to an offset voltage. Thus, two of the comparators shown in FIG. 4 can be included in the Schmitt trigger shown in FIG. 2. One of the comparators will have the voltage Vinp input to the third transistor 40 while the voltage Vinn is input to the fourth transistor 42. The other comparator will have the voltage Vinn input to the third transistor 40 and the voltage Vinp input to the fourth transistor 42. As the comparator shown in FIG. 4 inherently provides an offset, it is not necessary to provide the additional voltage sources shown in FIG. 2, which in the prior art is provided by a feedback circuit including a resistor. Accordingly, a fully differential Schmitt trigger can be formed with two comparators embodying the present invention without the need for resistors. It is possible to use embodiments of the invention where a single comparator is used to define the Schmit trigger. The offset voltage generation is provided by the comparator so offsetting elements can be avoided.

Figure 1:
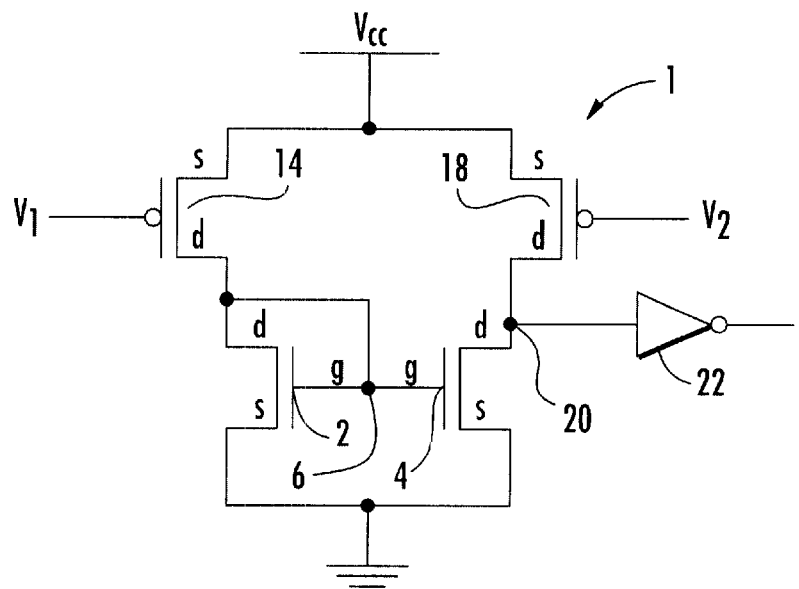
FIG. 1 shows a known comparator according to the prior art.

The significance of the value of Vx will now be described. Vx is an amount by which V2 must exceed V1 to obtain equal currents through the first and third transistors 30 and 40 and through the second and fourth transistors 32 and 42. In other words, when V1=V2+Vx, the current provided by the bias transistor 44 will be split into two equal currents. Half the current flows through the first and third transistors 30 and 34, and half the current flows through the second and fourth transistors. In the case of FIG. 1, Vx=0 as two matched pairs of transistors are provided.

The ratio of the current through the fourth transistor 42 to the current through the third transistor 40, where V1=V2= [(W/L) fourth transistor/(W/L) third transistor]=4, where W=width of the transistor channel and L=length of the transistor channel. Accordingly, as the third and fourth transistors 40 and 42 are not matched, different voltages need to be applied to the gates of these transistors to obtain equal currents.

Figure 5:
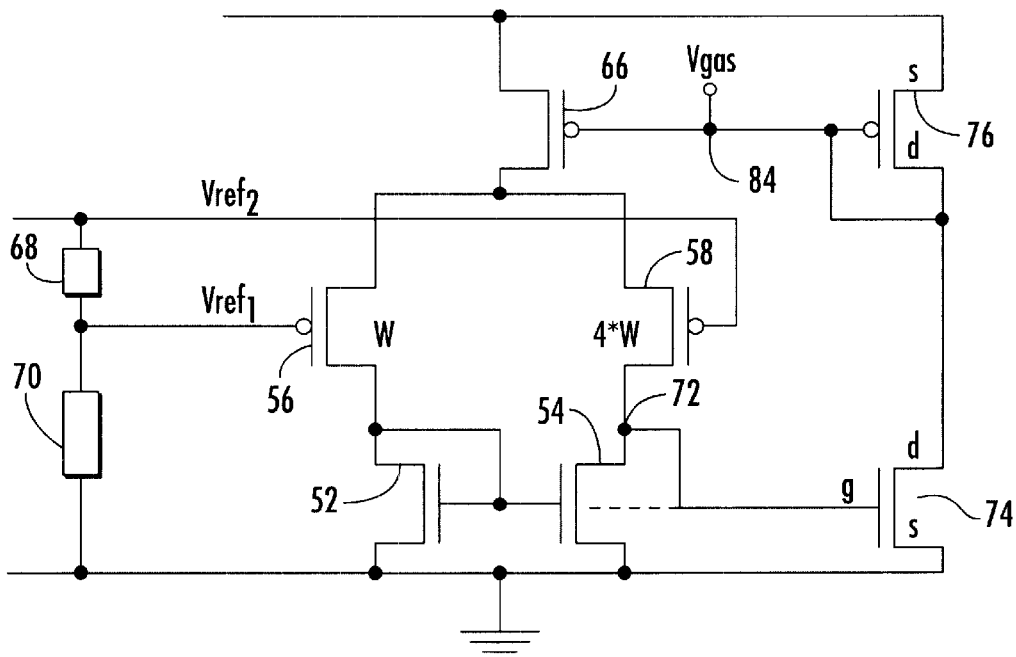
FIG. 5 shows a bias generator for use with the comparator illustrated in FIG. 4.

Reference will now be made to FIG. 5 which shows a bias generator for determining the bias current applied to the bias P channel transistor 44 of the comparator of FIG. 4. The bias generator comprises first and second N channel transistors 52 and 54 defining a first pair of transistors, and third and fourth P channel transistors 56 and 58 defining a second pair of transistors. The first, second, third and fourth transistors 52–58 of the circuit shown in FIG. 5 are substantially the same in characteristics and connections to the first, second, third and fourth transistors 30, 32, 40 and 42 of the comparator shown in FIG. 4.

In the bias generator of FIG. 5, the gates of the first and second transistors 52 and 54 are therefore connected together. The gate and drain of the first transistor 52 are connected together. The sources of the first and second transistors 52 and 54 are connected to ground. The drain of the first transistor 52 is connected to the drain of the third transistor 56, while the drain of the second transistor 54 is connected to the drain of the fourth transistor 58.

The sources of the third and fourth transistors 56 and 58 are connected to a second bias N channel transistor 66 which matches the bias N channel transistor 44 of the comparator of FIG. 4. The gate of the third transistor 56 is arranged to receive a reference voltage Vref1 while the gate of the fourth transistor 58 is arranged to receive a second reference voltage Vref2. Vref1 is less than Vref2. In order to generate Vref1, a potential divider arrangement is provided with first and second resistors 68 and 70 in series between a voltage supply and ground. The voltage between the first and second resistors 68 and 70 is tapped off to provide the first reference voltage Vref1. The second reference voltage Vref2 is the same as the voltage supply.

An output node 72 provides the output of the bias generator defined by the first to fourth transistors 52–58 respectively. The output node 72 provides the gate voltage for a sixth N channel transistor 74. The source of the sixth transistor 74 is connected to ground while the drain is connected to the drain of a seventh P channel transistor 76. The source of the seventh transistor 76 is connected to a voltage supply, as is the source of the second bias transistor 66. The gate of the seventh transistor 76 is connected to the gate of the second bias transistor 66. Additionally, the gate and drain of the seventh transistor 76 are connected together. The voltage at a bias node 84, which is between the gates of the bias transistor 66 and the seventh transistor 76 is tapped off to provide the bias voltage for the bias transistor 44 of the comparator of FIG. 4.

The operation of the bias generator shown in FIG. 5 will now be described. The arrangement shown in FIG. 5 is such that constant voltages Vref1 and Vref2 are applied to the gates of the third and fourth transistors 56 and 58. Accordingly, any change which occurs to the voltage at the output node 72 will result from the effects of changes in temperature on the performance of the first and second pairs of transistors 52–58. If the voltage on the output node 72 increases, this results in the voltage applied to the gate of the sixth transistor 74 to increase. This will make the sixth transistor 74 more conductive and will tend to pull the drain voltage of the seventh transistor closer to ground.

Accordingly, the gate voltage applied to the seventh transistor 76 and the second bias P channel transistor 66 will decrease. This in turn causes the second bias transistor 66 and the seventh transistor 76 to be turned on more quicky. If the second bias transistor 66 is turned on more quickly, then the voltage applied to the sources of the third and fourth transistors 56 and 58 will be increased, thus causing the voltage at output node 72 to be lowered.

The bias transistor 44 of the comparator circuit shown in FIG. 4 is provided with the bias voltage from the bias node 84 which will also cause the bias transistor 44 of the comparator circuit to be turned on more quicky. Thus, changes in the voltage at the output node 46 of the comparator of FIG. 4 can be attributed to changes in the relative values of the voltages V1 and V2 input to the gates of the third and fourth transistors 40 and 42, and not as a consequence of a change in temperature.

If the voltage at the output node 72 decreases, the voltage applied to the gate of the sixth transistor 74 is decreased.

Accordingly, the sixth transistor 74 is less quickly turned on. This means that the voltage at the drain of the seventh transistor 76 is increased. This means that the voltage applied to the gates of the second bias transistor 66 and the seventh transistor 76 increases. The second bias transistor 66 and the seventh transistor 76 are thus turned on less quickly. This means that less voltage is applied to the sources of the third and fourth transistors 56 and 58 which will tend to increase the voltage at the output node 72. The bias voltage taken from the bias node 84 is increased and is applied to the bias transistor 44 of the comparator in FIG. 4. This reduces the voltage applied by the bias transistor 44 to the sources of the third and fourth transistors 40 and 42. Once again changes in temperature can be compensated.

In the described embodiment, the third and fourth transistors of the comparator and the bias generator are described as having different characteristics. However, it is also possible to achieve a similar effect if the first and second transistors 52 and 54 are not matched. In some embodiments of the present invention, both pairs of transistors may have different characteristics. The embodiment shown in FIG. 5 may be used with several comparator circuits. For example, in a Schmitt trigger, a single bias generator as shown in FIG. 5 may be provided along with two comparator circuits as shown in FIG. 4. If the arrangement shown in FIG. 5 is not present, a constant bias voltage may be applied to the bias transistor 44.

Embodiments of the present invention can be used in a window comparator, in fuzzy logic circuits where low, medium and high logic levels are required or any other suitable application. It is preferred that the transistors be field effect transistors. However, it is also possible that embodiments of the present invention can be implemented with bipolar transistors. It should also be appreciated that the polarities of the transistors shown in FIGS. 4 and 5 can be reversed. Accordingly, the P channel transistors may be replaced by N channel transistors and N channel transistors replaced by P channel transistors.

That which is claimed:

1. A circuit for comparing a first voltage and a second voltage, the circuit comprising:
   a first comparator comprising
      a first current divider dividing a bias current in accordance with the first and second voltages and providing two currents, and
      a first current differentiation circuit receiving the two currents and providing an output signal dependent upon a difference between the two currents, wherein at least one of said first current divider and said first current differentiation circuit weights one of the two currents with respect to the other current so that the output signal is only provided when a difference between the first and second voltages exceeds an offset value; and
   a bias generator connected to said first comparator providing a bias voltage thereto, said bias generator comprising a second comparator comprising
      a second current divider dividing a bias current in accordance with values of a third and fourth voltage and providing two currents, and
      a second current differentiation circuit receiving the two currents and providing a second output signal dependent upon a difference between the two currents;
   said first and second comparators comprising substantially identical components arranged in a substantially identical configuration.

2. A circuit according to claim 1, wherein at least one of said first current divider and said first current differentiation circuit comprises a pair of transistors.

3. A circuit according to claim 2, wherein at least one pair of said pair of transistors is not matched to weight one of the two currents with respect to the other current.

4. A circuit according to claim 1, wherein said first current differentiation circuit comprises a current mirror.

5. A circuit according to claim 1, wherein said first current divider comprises a first pair of transistors of a first polarity; wherein said first current differentiation circuit comprises a second pair of transistors of a second polarity; wherein each transistor comprises a gate, a source and a drain; and wherein the gates of said first pair of transistors are respectively arranged to receive the first and second voltages, sources of said first pair of transistors are arranged to receive a part of the biasing current, and drains of said first pair of transistors are connected to the drains of a respective one of said second pair of transistors.

6. A circuit according to claim 5, wherein the sources of said second pair of transistors are connected to a second voltage reference, and the gates of said second pair of transistors are connected to the drain of one of said transistors of said second pair of transistors.

7. A circuit according to claim 6, wherein said second voltage reference is ground.

8. A circuit according to claim 5, wherein said first pair of transistors comprises P channel transistors and said second pair of transistors comprises N channel transistors.

9. A circuit according to claim 5, wherein said first pair of transistors are not matched.

10. A circuit according to claim 5, wherein said second pair of transistors are not matched.

11. A circuit according to claim 1, wherein a first output signal is provided if a difference between the first and second voltages exceeds a threshold, and a second output signal is provided if the difference is less than the threshold.

12. A circuit according to claim 1, further comprising an inverter connected to an output of said first comparator.

13. A circuit according to claim 1, wherein said first comparator further comprises a bias transistor connected to said first pair of transistors, said bias transistor having a control terminal receiving the bias voltage generated by said bias generator.

14. A circuit according to claim 1, wherein said second current divider comprises a first pair of transistors of a first polarity; wherein said second current differentiation circuit comprises a second pair of transistors of a second polarity; wherein each transistor comprises a gate, a source and a drain; and wherein the gates of said first pair of transistors are respectively arranged to receive the first and second voltages, sources of said first pair of transistors are arranged to receive a part of the biasing current, and drains of said first pair of transistors are connected to the drains of a respective one of said second pair of transistors; and said second comparator further comprising a second bias transistor connected to said first pair of transistors, said second bias transistor having a gate receiving a bias voltage.

15. A circuit according to claim 14, wherein said bias generator further comprises a compensation circuit changing the bias voltage applied to said second bias transistor in response to changes in a voltage output by said first and second pairs of transistors of said bias generator.

16. A circuit according to claim 15, wherein said compensation circuit is coupled to the second output and to the gate of said second bias transistor so that a voltage applied to the gate of said second bias transistor is also applied as the bias voltage to said bias transistor of said comparator.

17. A circuit according to claim 16, wherein said compensation circuit comprises:
a sixth transistor having a gate connected to the second output of said second comparator; and
a seventh transistor having a gate connected to the gate of said second bias transistor.

18. A circuit according to claim 17, wherein said sixth transistor has a first polarity and said seventh transistor has a second polarity.

19. A circuit according to claim 18, wherein said seventh transistor comprises a source and a drain with the gate connected to the drain.

20. A circuit according to claim 1, wherein the third and fourth voltages are constant voltages.

21. A circuit according to claim 20, further comprising a potential divider for providing the constant voltages.

22. A circuit according to claim 1, wherein said transistors comprises field effect transistors.

23. A circuit according to claim 1, further comprising a substrate, wherein said first comparator and said bias generator are formed in said substrate so that the circuit is an integrated circuit.

24. A Schmitt trigger comprising:
a plurality of comparators, each comparator comprising
a first current divider dividing a bias current in accordance with values of first and second voltages and providing two currents, and
a first current differentiation circuit receiving the two currents and providing an output signal dependent upon a difference between the two currents, wherein at least one of said first current divider and said first current differentiation circuit weights one of the two currents with respect to the other current so that the output signal is only provided when a difference between the first and second voltages exceed an offset value; and
a single bias generator connected to said at least one of said plurality of comparators for providing a bias voltage, said bias generator comprising a second comparator comprising
a second current divider dividing a bias current in accordance with values of a third and fourth voltage and providing two currents, and
a second current differentiation circuit receiving the two currents and providing a second output signal dependent upon a difference between the two currents;
each of said plurality of comparators and said second comparator comprising substantially identical components arranged in a substantially identical configuration.

25. A Schmitt trigger according to claim 24, wherein each comparator operates with a same voltage threshold.

26. A Schmitt trigger according to claim 24, wherein said first current divider comprises a first pair of transistors of a first polarity; wherein said first current differentiation circuit comprises a second pair of transistors of a second polarity; wherein each transistor comprises a gate, a source and a drain; and wherein the gates of said first pair of transistors are respectively arranged to receive the first and second voltages, sources of said first pair of transistors are arranged to receive a part of the biasing current, and drains of said first pair of transistors are connected to the drains of a respective one of said second pair of transistors.

27. A Schmitt trigger according to claim 26, wherein said first pair of transistors comprises P channel transistors and said second pair of transistors comprises N channel transistors.

28. A Schmitt trigger according to claim 26, wherein said first pair of transistors are not matched.

29. A Schmitt trigger according to claim 26, wherein said second pair of transistors are not matched.

30. A Schmitt trigger according to claim 24, wherein a first output signal is provided if a difference between the first and second voltages exceeds a threshold, and a second output signal is provided if the difference is less than the threshold.

31. A Schmitt trigger according to claim 24, further comprising an inverter connected to an output of said comparator.

32. A Schmitt trigger according to claim 24, wherein said comparator further comprises a bias transistor connected to said first pair of transistors, said bias transistor having a control terminal receiving the bias voltage generated by said bias generator.

33. A Schmitt trigger according to claim 24, wherein said second current divider comprises a first pair of transistors of a first polarity; and wherein said second current differentiation circuit comprises a second pair of transistors of a second polarity; wherein each transistor comprises a gate, a source and a drain; and wherein the gates of said first pair of transistors are respectively arranged to receive the third and fourth voltages, sources of said first pair of transistors are arranged to receive a part of the biasing current, and drains of said first pair of transistors are connected to the drains of a respective one of said second pair of transistors; and said second comparator further comprising a second bias transistor connected to said first pair of transistors, said second bias transistor having a gate receiving a bias voltage.

34. A Schmitt trigger according to claim 33, wherein said bias generator further comprises a compensation circuit changing the bias voltage applied to said second bias transistor in response to changes in a voltage output by said first and second pairs of transistors of said bias generator.

35. A Schmitt trigger according to claim 34, wherein said compensation circuit is coupled to the second output and to the gate of said second bias transistor so that a voltage applied to the gate of said second bias transistor is also applied as the bias voltage to said bias transistor of said comparator.

36. A Schmitt trigger according to claim 35, wherein said compensation circuit comprises:

a sixth transistor having a gate connected to the second output of said second comparator; and a seventh transistor having a gate connected to the gate of said second bias transistor.

37. A Schmitt trigger according to claim 36, wherein said sixth transistor has a first polarity and said seventh transistor has a second polarity.

38. A Schmitt trigger according to claim 37, wherein said seventh transistor comprises a source and a drain with the gate connected to the drain.

39. A Schmitt trigger according to claim 24, wherein the third and fourth voltages are constant voltages.

40. A Schmitt trigger according to claim 39, further comprising a potential divider for providing the constant voltages.

41. A Schmitt trigger according to claim 24, wherein said transistors comprises field effect transistors.

42. A Schmitt trigger according to claim 24, further comprising a substrate, wherein said plurality of comparators and said bias generator are formed in said substrate so that the Schmitt trigger is an integrated circuit.

43. A method for comparing a first voltage and a second voltage, the method comprising the steps of:

dividing a bias current into two currents in response to a bias voltage in accordance with values of the first and second voltages;

providing an output signal dependent upon a difference between the two currents, wherein one of the two currents is weighted with respect to the other current so that the output signal is only provided when a difference between the first and second voltages exceed an offset value; and generating the bias voltage by dividing a second bias current into two currents in response to a second bias voltage in accordance with values of a third and fourth voltage, and providing a second output signal dependent upon a difference between the two currents;

the dividing of bias current and the dividing of the second bias current is performed using respective circuits comprising substantially identical components arranged in a substantially identical configuration, and the providing of the output signal and the providing of the second output signal is performed using respective circuits comprising substantially identical components arranged in a substantially identical configuration.

44. A method according to claim 43, wherein a first output signal is provided if a difference between the first and second voltages exceeds a threshold, and a second output signal is provided if the difference is less than the threshold.

45. A method according to claim 43, wherein the step of generating the bias voltage comprises compensating the bias voltage in response the second output signal.

46. A method according to claim 43, further comprising providing a respective constant voltage for the third and fourth voltages.

47. A method according to claim 46, wherein the step of providing the respective constant voltages comprises dividing the voltages using a potential divider.

* * * * *